United States Patent [19]

Clarke et al.

[11] Patent Number: 4,544,417
[45] Date of Patent: Oct. 1, 1985

[54] TRANSIENT CAPLESS ANNEALING PROCESS FOR THE ACTIVATION OF ION IMPLANTED COMPOUND SEMICONDUCTORS

[75] Inventors: Rowland C. Clarke, Penn Hills; Graeme W. Eldridge, Murrysville, both of Pa.

[73] Assignee: Westinghouse Electric Corp., Pittsburgh, Pa.

[21] Appl. No.: 499,083

[22] Filed: May 27, 1983

[51] Int. Cl.$^4$ .................. H01L 21/265; H01L 21/324
[52] U.S. Cl. ........................ 148/1.5; 29/575; 29/576 B; 29/576 T; 148/175; 148/DIG. 3; 148/DIG. 22; 148/DIG. 24
[58] Field of Search .................. 148/1.5, 175; 29/575, 29/576 T, 576 B

[56] References Cited

U.S. PATENT DOCUMENTS

| | | | |
|---|---|---|---|
| 3,974,002 | 8/1976 | Casey et al. | 148/1.5 X |
| 3,984,263 | 10/1976 | Asao et al. | 148/1.5 X |
| 4,135,952 | 1/1979 | Anderson et al. | 148/1.5 |
| 4,174,982 | 11/1979 | Immorlica | 148/1.5 X |
| 4,312,681 | 1/1982 | Rupprecht et al. | 148/1.5 |

OTHER PUBLICATIONS

Lee et al., "Characteristics of Implanted . . . Annealed . . . Atmosphere", Ion Implantation in Semiconductors 1976 (Text), Plenum Press, N.Y., 1976.
Malbon et al., "Annealing of Ion-Implanted GaAs in a Controlled Atmosphere", J. Electrochem. Soc., vol. 123, No. 9, Sep. 1976, pp. 1413–1415.
Molnar et al. "Capless Annealing of Ion Implanted InP and GaAs . . . ", Text–Gallium Arsenide and Related Compound, 1980, Inst. of Physics, London.
Woodall et al., "Proximate Capless Annealing . . . As Vapor . . . " Appl. Phys. Lett., vol 38, No. 8, Apr. 15, 1981, pp. 639–641.

Primary Examiner—William G. Saba
Attorney, Agent, or Firm—Walter G. Sutcliff

[57] ABSTRACT

A method and apparatus is described for activating implants in gallium arsenide incorporating crushed gallium arsenide and hydrogen to form a gas mixture to provide an atmosphere for the gallium arsenide to be activated and a furnace for heating the crushed gallium arsenide to a first temperature and the gallium arsenide to be activated to a second temperature. The invention overcomes the problem of wafer loss at the surface by evaporation during anneal and activation of gallium arsenide.

6 Claims, 6 Drawing Figures

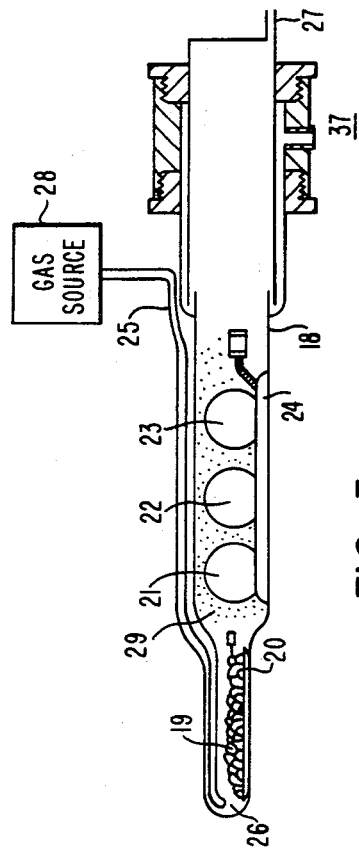
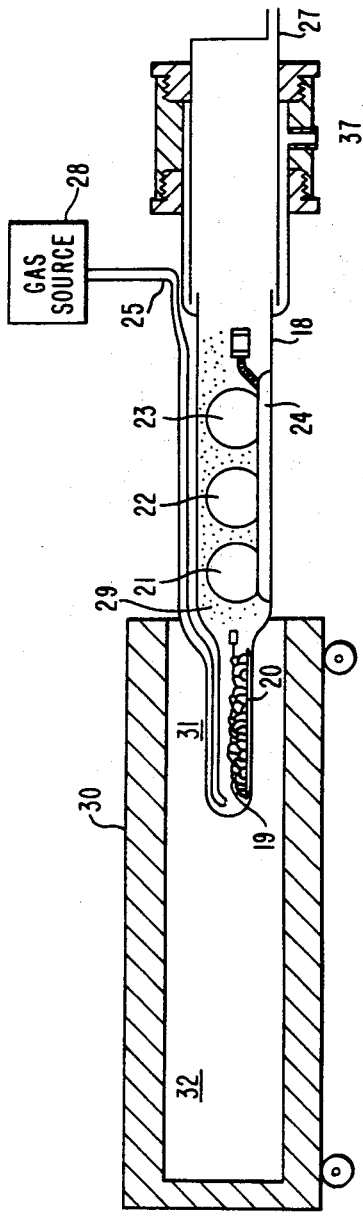
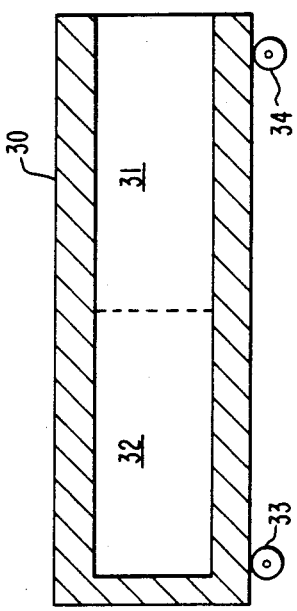
FIG. 3
FIG. 4

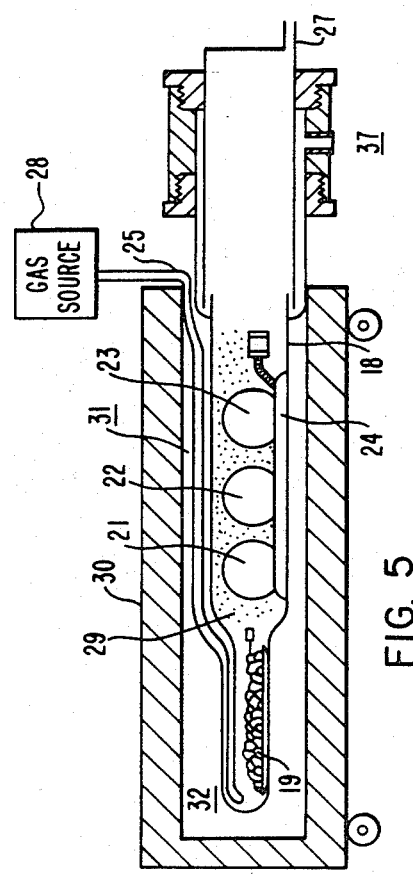
FIG. 5
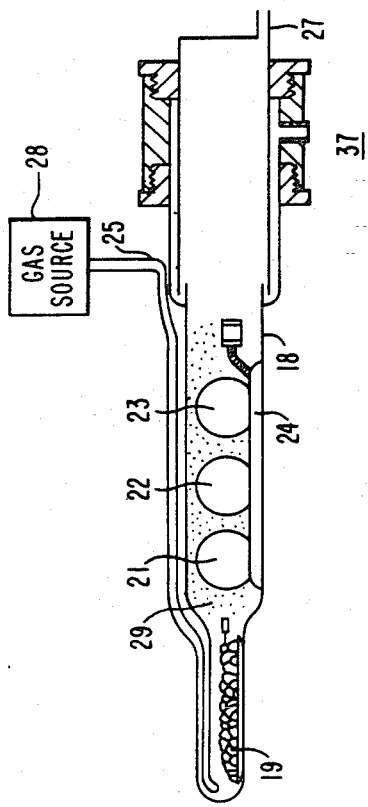
FIG. 6
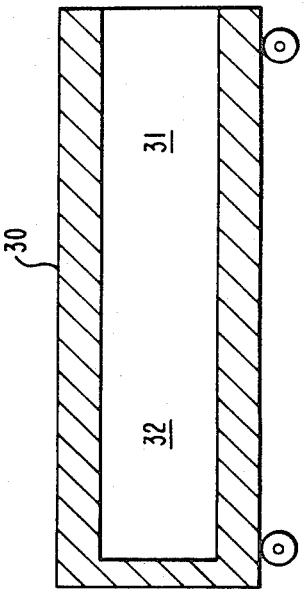

TRANSIENT CAPLESS ANNEALING PROCESS FOR THE ACTIVATION OF ION IMPLANTED COMPOUND SEMICONDUCTORS

BACKGROUND OF THE INVENTION

1. Field of the Invention

This invention relates to semiconductor devices and, more particularly to an annealing process for the activation of ion implanted compound semiconductors such as gallium arsenide.

2. Description of the Prior Art

Ion implantation of doping species into semi-insulating wafers of gallium arsenide followed by thermal annealing and activation has been demonstrated as a viable technique in the preparation of electronic devices, in particular, field effect transistors, injection lasers, and monolithic integrated circuits. Numerous methods for the activation of implanted species in gallium arsenide have been described in the literature but none has yet fulfilled the need for commercially applicable technology. During the anneal process the temperature of the gallium arsenide material is raised, such as for example, to 850° C. for 30 minutes wherein the constituents gallium and arsenide tend to evaporate non-stoichiometrically from the gallium arsenide wafer.

Three factors determine the properties of a thermally activated implant: (1) the energy and uniformity of the implanted dose, (2) the purity and stoichiometry of the gallium arsenide wafer, and (3) the reliability of the activation and anneal process. Commercially available ion-implanting machines offer close tolerances of ion impurity, ion energy, and ion distribution; typically, less than 3% variation in properties across a 3-inch diameter field is quoted in technical specifications. In the past the purity and stoichiometry of the gallium arsenide wafer have been variable, especially with Bridgman-grown ingots which were compensated by heavy chromium doping, and frequently contained trap concentrations comparable to the implanted dose. More recently a very reliable gallium arsenide wafer has become available which is prepared by liquid-encapsulated Czochralski (LEC) growth in pyrolytic boron nitride (PBN) crucibles. These (100) orientation large-diameter (2 and 3 inch) crystals contained trap concentrations at least an order of magnitude below that of the implanted dopant normally employed in fabricating field effect transistors and integrated circuits. Therefore, researchers in industry have turned their attention to the third factor, the activation of an implanted dose in PBN LEC gallium arsenide wafers to perfect a commercially attractive, ion implanted, elecronic device technology for gallium arsenide. The minimum temperature for substantial implant activation in gallium arsenide is between 750° C. and 800° C. This high temperature is necessary in order to anneal damage present in the gallium arsenide lattice caused by the penetration of high-energy ions, and to move the implanted ions to electrically activate substitutional sites. Straightforward heating of a gallium arsenide wafer to the activation temperature suffers from two drawbacks. First, the vapor pressure of gallium arsenide is substantial in this temperature range, so that the gallium arsenide surface is eroded; second, the evaporation is not congruent, so the arsenic and gallium losses are not equal. From the vapor pressure/temperature diagram for gallium arsenide, it is clear that any temperature above the congruent evaporation temperature (650° C.) that might be used to activate an implant will result in incongruent loss of the wafer surface. The result of incongruent wafer loss is evident as surface roughness and a substantial arsenide vacancy concentration.

Techiques intended to prevent wafer erosion during thermal activation can be divided into two types: capped and capless. In capped annealing, the implanted gallium arsenide wafer is coated with a thin encapsulant (cap) of inert material to prevent any loss of volatile elements during the high temperature implantation anneal. Investigated caps include $SiO_2$, $Si_3N_4$, $Al_2O_3$, AlN, $Ga_2O_3$, and Al.

Numerous problems are associated with capped annealing. The cap in the gallium arsenide may react or interdiffuse during the anneal, contamination of the cap may contaminate the implant, non-uniform cap deposition may give rise to pinholes or surface eruptions, and thermal stresses may arise between the cap and the wafer that affect the electrical properties of the implants or cause cracking of the cap with consequent wafer loss.

In the capless annealing technique, the implanted gallium arsenide wafer is annealed in an atmosphere to prevent out-gassing of the wafer. The wafer would then retain its stoichiometric nature without the use of a cap. In a paper entitled "Semi-Sealing Capless Anneal of GaAs," by J. Kasahara and N. Watanabe, published in Jap. Jnl. Appl. Phys., Vol. 19, No. 11, p. L679 (1980), arsenic was used as a source of arsenic overpressure during anneal of gallium arsenide wafers. In a paper entitled "Capless Anneal of Ion Implanted GaAs in a Controlled Arsenic Vapor," by J. Kasahara, M. Arai and N. Watanabe, published in J. Appl. Phys. Vol. 50, No. 1, p. 541 (1979), arsine gas was used as a source of arsenic overpressure during anneal of gallium arsenide wafers.

In a paper entitled "Proximate Capless Annealing Using a Controlled-Excess as Vapor Pressure Source," by J. M. Woodall, H. Rupprecht and R. J. Chicotka, published in Appl. Phys. Lett. 38(8), p. 639 (1981), indium arsenide was used as a source of arsenic overpressure during anneal of gallium arsenide wafers. It should be noted, however, that the methods incorporating arsenic overpressure do not prevent erosion of the gallium arsenide wafer but merely reduce wafer loss to that of the gallium evaporation loss. Measurements of wafer loss of 1,000 Angstroms per hour have been observed during arsenic-stabilized annealing, leading to a buildup of non-volatile, compensating impurities on the surface of the wafer, together with a gallium vacancy concentration. These deficiencies are particularly damaging to an implanted-device technology, since most implant profiles are of submicron dimensions. Furthermore, the formation of ohmic contacts and Schottky barrier contacts for device construction crucially depend on low surface-compensation ratios, a requirement not met by arsenic overpressure methods.

In proximity cap annealing technique, implanted wafers, perfectly parallel polished and of the same crosssection, are stacked upon each other and heated to the anneal temperature, the loss of material from the implanted wafer surface would be small, since the available volume for evaporation is minimized. In a paper entitled "Ion Implanted Gallium Arsenide with Proximity Cap Annealing," by R. P. Mandal and W. R. Scoble, published in Gallium Arsenide and Related Compounds 1978, Inst. Phys. Conf. Ser. No. 45, Ch. 6, p. 462 (1979), discusses proximity cap annealing. In a paper entitled "Close Contact Annealing of Ion Implanted GaAs and InP," Appl. Phys. Lett. 36, No. 11, p. 927 (1980) by B. Molnar, proximity cap annealing was discussed. In these papers, both P and N type implants have been activated with up to 80% differential activation efficiency. However, significant variations in activation were observed between the center and edge of a boule as discussed in a paper entitled "Segregation Effects on Electrical Properties of Ion Implanted Proximity Annealed GaAs (Cr)," by W. M. Duncan, F. H. Doerbeck and G. E. Brehm, published in Workshop on Compound Semiconductors and Devices WOCSEMMAD (1981). With proximity cap annealing, the least-activated regions are around the edges of the wafers. For a proximity cap anneal to operate successfully, the wafers must be touching over most of the active surface, a difficult achievement over a 2- or 3-inch diameter wafer, allowing for the capricious possibility of dust particles, thermal stress, bowing, etc., making the process somewhat unreliable.

In a paper entitled "Annealing of Ion Implanted GaAs in a Controlled Atmosphere," by R. M. Malbon, D. H. Lee, and J. M. Whelan, published in the J. Electrochem. Soc., Vol. 123, No. 9, p. 1413 (1976), implanted 2 centimeter square wafers of epitaxial gallium arsenide were annealed using an arsenic pressure from a gallium/gallium arsenide mixture and a small hydrogen flow. It is believed that the vapor pressure of arsenic produced by a hot mixture of gallium in gallium arsenide is not predictable and as a consequence, the annealing of implants by using this technique would not be reproducible.

It is therefore desirable to provide a capless annealing technique for the activation of N and P type implants in gallium arsenide at a relatively low temperature that shows high uniformity and reproducible activation.

It is further desirable to provide a capless annealing process which is both rapid and adaptable to volume production of gallium arsenide wafers.

It is further desirable to provide a capless annealing process which yields a gallium arsenide wafer morphology indistinguishable from the "as polished" condition.

It is further desirable to provide a capless annealing process wherein stablilizing overpressures for all the substrate constituents are provided such as both gallium and arsenic in the case of the gallium arsenide example.

It is further desirable to provide a capless annealing process wherein these overpressures are generated from the purest possible source as may be achieved from undoped sacrificial wafers crushed to enhance the sublimation area.

It is further desirable to provide a capless annealing process in a vapor phase epitaxy-like configuration such that proper generation of the appropriate overpressures of all substrate constitutents can be demonstrated by growth of high quality homoeptiaxial layers in the same apparatus.

SUMMARY OF THE INVENTION

A method and apparatus is described for activating N and P type implants in compund semiconductors such as gallium arsenide wafers comprising crushed gallium arsenide, a source of hydrogen pouring over the crushed gallium arsenide solid to provide a gas mixture including gallium, arsenic, and hydrogen, gallium arsenide wafers to be activated positioned in the gas mixture, and a furnace for heating the crushed gallium arsenide to a first temperature and for heating the gallium arsenide wafers to be activated to a second temperature.

BRIEF DESCRIPTION OF THE DRAWINGS

FIGS. 3-6 are schematic diagrams showing a movable furnace, a tube, gallium arsenide wafers, and crushed gallium arsenide meterial.

DESCRIPTION OF THE PREFERRED EMBODIMENT

Figure 1:
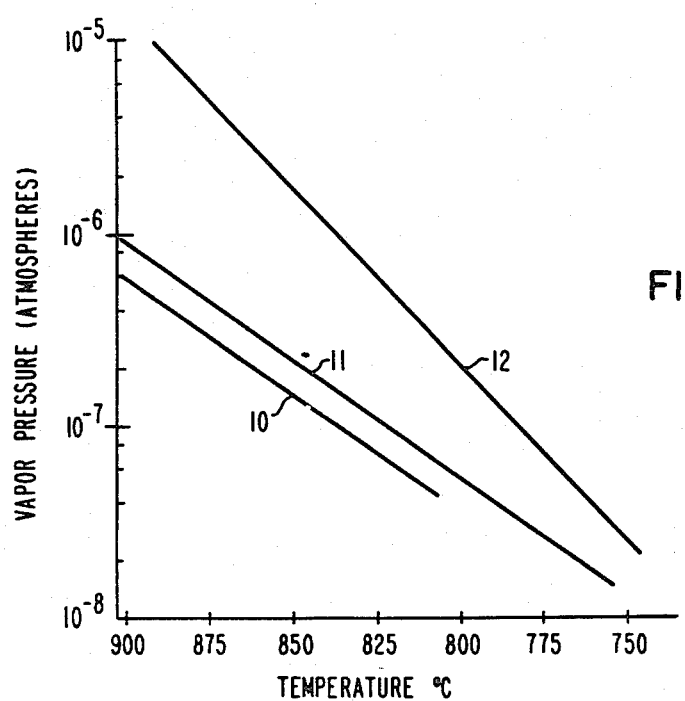
FIG. 1 is a graph of vapor pressure versus temperature for gallium and arsenic gas over gallium arsenide.

Referring to the drawings and in particular to FIG. 1, a graph is shown showing vapor pressure in atmospheres as a function of temperature for gallium and arsenic in the vapor phase over gallium arsenide in the solid phase. In FIG. 1, the ordinate represents vapor pressure in atmospheres and the abscissa represents temperature in degrees Centigrade. Curve 10 in FIG. 1 shows the vapor pressure for gallium in the vapor phase above gallium arsenide in the solid phase. Curve 11 shows the vapor pressure of gallium in the vapor phase over gallium in the liquid phase. Curve 12 shows the vapor pressure of arsenic, As$_2$, over gallium arsenide in solid phase. As can be seen in FIG. 1, the vapor pressure of arsenic is always greater than the vapor pressure of gallium over the solid material of gallium arsenide at any particular temperature.

Figure 2:
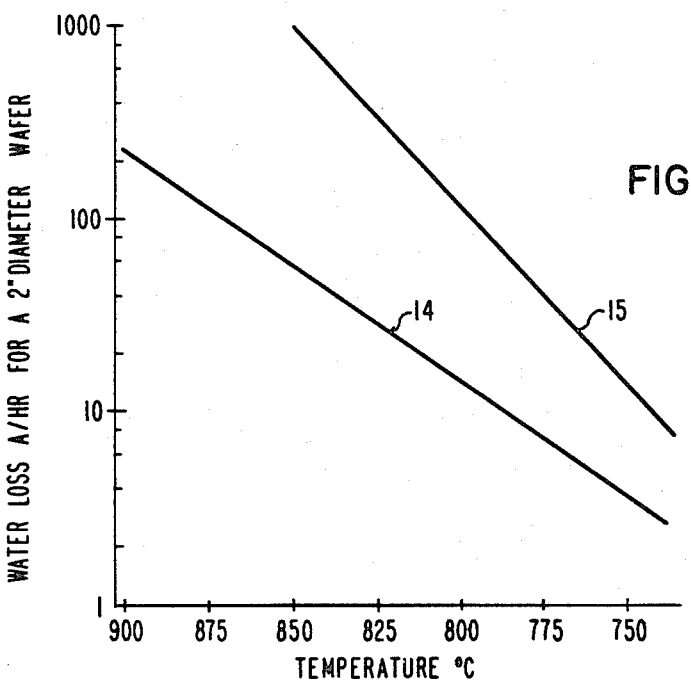
FIG. 2 is a graph of wafer loss in Angstroms per hour as a function of temperature due to erosion of arsenic or gallium from gallium arsenide.

FIG. 2 shows a graph of wafer loss as a function of temperature for the erosion due to gallium loss or arsenic loss. In FIG. 2, the ordinate represents wafer loss in Angstroms per hour and the abscissa represents temperature in degrees Centigrade. Curve 14 represents the erosion of the wafer due to gallium loss from gallium arsenide in the solid phase. Curve 15 represents the erosion of the wafer due to arsenic loss from gallium arsenide in the solid phase. Equation 1 shows the relationship between gallium arsenide in the solid phase and gallium in the liquid and vapor phase and arsenic in the vapor phase.

$$2GaAs_{(s)} \rightleftharpoons 2Ga_{(l)(v)} + 2As_{2(v)} \tag{1}$$

As can be seen in FIG. 2, arsenic is lost from gallium arsenide at a faster rate than gallium at any particular temperature. Furthermore, FIG. 2 shows that gallium is lost from gallium arsenide solid material at temperatures above 750° C. It is noted by Equation 1 that the transfer of gallium and arsenic to or from the gallium arsenide solid material may go in either direction. Under the right conditions of excessive vapor pressure, gallium and arsenide may be deposited on the gallium arsenide solid material. Of course with a lower vapor pressure, the gallium arsenide solid material will tend to loose gallium and arsenic to the vapor phase.

Referring to FIG. 3, a housing or tube 18 is shown suitable for holding or supporting gallium arsenide wafers and crushed gallium arsenide which are spaced apart and for holding gas within the tube. The crushed gallium arsenide 19 may, for example, be in a boat 20 in a first region of tube 18. The gallium arsenide wafers 21-23 may, for example, be positioned in a carrier 24 in a second region in tube 18. As can be seen in FIG. 3, the crushed gallium aresenide is spaced apart from the gallium arsenide wafers 21-23. A tube 25 which enters tube 18 at point 26 provides a gas such as hydrogen from gas source 28 which flows over the crushed gallium arsenide 19 to form a gas mixture 29 comprising gas source 28. Gallium and arsenic gas mixture 29 then flows over gallium arsenide wafers 21–23 prior to exiting exit tube 27.

Wafers 21–23 may, for example, be in a size from 2 to 3 inches in diameter having the upper surface in the (100) orientation. The gallium arsenide wafers 21–23 may, for example, be obtained from liquid-encapsulated Czochralski (LEC) gallin arsenide crystals grown in a pyrolytic boron nitride (PBN) crucibles. The crystalline gallium arsenide wafers may be implanted directly with silicon or magnesium at ambient temperature, using ion energies of 20 KEV to 800 KEV at doses calculated to achieve doping densities of $3 \times 10^{16}/cm^3$ to $3 \times 10^{19}/cm^3$. The ion implantation beam may be at an angle of 7° orthogonal to the wafer surface to reduce channeling effects.

Crushed gallium arsenide 19 may, for example, be crushed or ground up gallium arsenide wafers which are obtained from high purity crystals grown by the liquid-encapsulated Czochralski (LEC) method in pyrolytic boron nitride (PBN) crucibles. The crushed or ground up gallium arsenide solid provides additional surface area for passing from the solid phase to the vapor phase. The slight decomposition of the crushed gallium arsenide 19 creates both gallium and arsenic vapor pressure in tube 18 greater than the decompsition pressure of the gallium arsenide wafers 21–23 by virtue of a temperature differential between the crushed gallium arsenide 19 and the gallium arsenide wafers 21–23.

Furnace 30 provides a means of first heating crushed gallium arsenide 19 by rolling the furnace over the tube in the first region where the crushed gallium arsenide 19 is located. Furnace 30 has a region 31 and a second region 32 wherein the temperature of regions 31 and 32 may be controlled independently. For example, region 31 may have a temperatue of 785° C. and region 32 may have a temperature of 820° C. The size of regions 31 and 32 are positioned and adjusted to correspond to the first and second regions within tube 18. As furnace 30 is rolled towards tube 18, the crushed gallium arsenide 19 may be positioned in region 31 for a first time period and into region 32 for a second time period while concurrently the gallium arsenide wafers 21–23 would be in region 31. Wheels 33 and 34 provide a means for rolling furnace 30 into position with respect to tube 18.

After loading the crushed gallium arsenide 19 and the gallium arsenide wafers 21–23 into first and second regions of tube 18, all air is swept from the tube which may, for example, be silica by flushing tube 18 with nitrogen for 30 minutes at a rate of two liters per minute which would be injected into tube 18 by means of tube 25. After flushing with nitrogen, a transport gas such as hydrogen would be introduced into tube 25 for 30 minutes at the rate of two liters per minute.

Next, the hydrogen flow into tube 25 is reduced to 100 cubic centimeters per minute. Furnace 30 is then rolled towards tube 18 such that region 31 of furnace 30 is positioned over the first region of tube 18 holding the crushed gallium arsenide 19. Region 31 of furnace 30 raises the temperature of the crushed gallium arsenide 19 to 785° C. while gallium arsenide wafers 21–23 are outside of furnace 30. This step ensures an arsenic overpressure in the second region of tube 18 throughout the anneal cycle of the gallium arsenide wafers 21–23. The typical time duration wherein region 31 of furnace 30 heats the crushed gallium arsenide 19 is, for example, 15 minutes. FIG. 4 shows the position of furnace 30 with respect to tube 18 during the time when only the crushed gallium arsenide 19 is heated by furnace 30.

Next the furnace 30 is rolled with respect to tube 18 such that gallium arsenide wafers 21–23 are in region 31 of furnace 30 and crushed gallium arsenide 19 is in region 32 of furnace 30 as shown in FIG. 5. Gallium arsenide wafers 21–23 become heated to 785° C., the temperature of region 31 of furnace 30, in less than 5 minutes. After a predetermined time period, the wafers are at 785° C. and the crushed gallium arsenide 19 is at 820° C., the temperature of region 32. The furnace is then withdrawn from tube 18 completely. Tube 18 and the crushed gallium arsenide 19 within it and the gallium arsenide wafers 21–23 are allowed to cool for 60 minutes. It is understood that during this time hydrogen at a flow rate of 100 cubic centimeters per minute is flowing in inlet tube 25 and is exhausted after passing over crushed gallium arsenide 19 to form gas mixture 29 and then over gallium arsenide wafers 21–23 out exit tube 27. An O-ring assembly 37 permits the annealed gallium arsenide wafers 21–23 to be removed from tube 18 as well as the crushed gallium arsenide.

During the anneal time when the furnace is positioned over tube 18 such as shown in FIG. 5, hydrogen in the first region of tube 18 which may, for example, be 1 inch in diameter, so as to achieve close vapor/solid contact, passes over high purity PBN LEC gallium arsenide solid at 820° C. and picks up an equilibrium vapor pressure of gallium and arsenic to form gas mixture 29. Gas mixture 29 then passes down tube 18 into the second region which is larger such as 4 inches in diameter, for example, where the gallium arsenide wafers 21–23 are located and at a temperature of 785° C. From the evaporation data shown in FIG. 1, the surface decomposition rate of an unprotected gallium arsenide crystal may be calculated for each anneal temperature, as provided by FIG. 2. The curves of erosion rate in FIG. 2 indicate the depth destroyed by gallium loss and arsenic loss from a 2-inch diameter gallium arsenide wafer. Dependent on the temperature differential between regions 32 and 31 of furnace 30, gallium may be lost or gained at the gallium arsenide wafer surface according to Equation 1. In the present case where region 32 is at an elevated temperature with respect to region 31, a net gain of material at the gallium arsenide wafers 21–23 is expected. However, the rate of growth of the gallium arsenide on the gallium arsenide wafers 21–23 is governed by the slow transport rate of the gallium, the minority component of the vapor. Considering a source temperature for region 32 of 820° C. and an anneal temperature for region 31 of 785° C., FIG. 2 shows that less than 10 Angstroms per hour of gallium arsenide would be deposited on the surface of gallium arsenide wafers 21–23 assuming complete reaction; therefore, it is concluded that transient capless annealing performed as outlined herein has a negligible morphological or electrical effect during the annealing of implantation damage and the activation of the implanted impurity in gallium arsenide wafers 21–23.

The effectiveness of this annealing process was assessed using C-V profiling and Hall measurements to establish profile shape, activation uniformity, differential activation efficiency, and carrier mobility. The C-V data indicates surface compensation less than $1 \times 10^{16}/cm^{-3}$, profile abruptness superior to 860° C., encapsulated anneals and peak net concentration uniformity and reproducibility better than 5 percent across a 2-inch wafer.

The Hall data indicates complete activation of implanted silicon with 93% of the silicon acting as donors and 7% as acceptors. The room temperature electron mobility compares favorably with $Si_3N_4$ 860° C. encapsulated anneals throughout the range $2 \times 10^{16}$ cm$^{-3}$ to $5 \times 10^{17}$ cm$^{-3}$: 5400 cm$^2$/v/second at $2 \times 10^{16}$ cm$^{-3}$, 5000 cm$^2$/v/second at $1 \times 10^{17}$ cm$^{-3}$, and 1500 cm$^2$/v/second at $5 \times 10^{17}$ cm$^{-3}$ was measured for capless activated samples. Activation and mobility data indicated a residual compensating center in undoped semi-insulating liquid-encapsulated Czochralski gallium arsenide with a seed concentration close to $8 \times 10^{15}$ cm$^{-3}$ gradually incrasing with solidified fraction.

Using the same technology, $^{24}Mg^+$ implants were activated with an activation efficiency of 65% at $2 \times 10^{17}$ cm$^{-3}$. Desired doping in the range $5 \times 10^{16}$ cm$^{-3}$ to $1.2 \times 10^{18}$ cm$^{-3}$ was achieved with near theoretical hole mobilities; at $2 \times 10^{17}$ cm$^{-3}$ a hole mobility of 290 cm$^2$/v/seconds was observed.

Low noise gallium arsenide metal semiconductor field effect transistors were fabricated in the N-type activated implants. Special double implants were used to bring the surface to $5 \times 10^{17}$ cm$^{-3}$ overlying a $2 \times 10^{17}$ cm$^{-3}$ 1200 Angstrom thick channel. The devices showed negligible looping and light sensitivity with a gain of 110 ms/mm at a knee voltage of 1.4 volts and the distribution of channel current with area showed a standard deviation of less than 10% over a 2-inch wafer.

Capless activated magnesium implants were used as low leakage P-I-N diodes. The reverse-biased junction currents were in the low to mid $10^{-9}$ amps/cm$^2$ range at 10 volts bias and the diodes had breakdown voltages as high as 250 volts.

The capless annealing process described here is fast, clean, reproducible, and lends itself to large volume production. The simultaneous activation of p++ and n++ selective implants in high purity liquid-encapsulated Czochralski substrates is expected to lead to new integrated circuit possibilities.

While the embodiment has been described for annealing and activating gallium arsenide, other ion implanted compound semiconductors may likewise be annealed and activated which include but are not limited to the following binary, ternary and quaternary semiconductor compounds: indium phosphide, indium arsenide, gallium aliuminum arsenide, cadmium telluride, zinc selenide, mercury cadmium telluride, and gallium indium arsenide phosphide.

We claim:

1. A method for activating and caplessly annealing a plurality of implanted gallium arsenide wafers disposed within an enclosed container on a volume production basis comprising the steps of:
   heating dry crushed sacrificial gallium arsenide disposed within the enclosed container to a first temperature;
   flowing hydrogen over said dry crushed sacrificial gallium arsenide to provide a gas mixture including gallium, arsenic and hydrogen;
   flowing said gas mixture over said gallium arsenide wafers to be activated; and
   heating said gallium arsenide wafers to be activated to a second temperature, with the first temperature in greater than the second temperature to maintain a gallium and arsenic overpressure encompassing the wafers, said overpressure exceeding the decompositional pressure of the elements from the wafer and, terminating heating of both the sacrificial gallium arsenide and the wafer while maintaining flowing of the gas mixture over the wafer until the wafers are cooled.

2. The method of claim 1 wherein said first temperature is at least 820° C.

3. The method of claim 1 wherein said second temperature is at least 785° C.

4. The method of claim 1 wherein said step of heating said sacrificial dry crushed gallium arsenide includes the positioning of a furnace around the portion of the enclosed container in which said dry crushed sacrificial gallium arsenide is disposed.

5. The method of claim 1 wherein said step of heating said gallium arsenide wafers to be activated includes the positioning of a furnace around the portion of the enclosed container in which said multiple gallium arsenide wafers are to be activated are disposed.

6. The method of claim 1 further including the step of cooling the gallium arsenide to be activated below a third temperature.

* * * * *